(12) United States Patent
Mishra et al.

(10) Patent No.: US 8,400,340 B2
(45) Date of Patent: Mar. 19, 2013

(54) ACHIEVING HIGH DYNAMIC RANGE IN A SIGMA DELTA ANALOG TO DIGITAL CONVERTER

(75) Inventors: Vineet Mishra, Bangalore (IN); Jayawardan Janardhanan, Bangalore (IN); Samala Sreekiran, Bangalore (IN); Meghna Agrawal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 64 days.

(21) Appl. No.: 13/184,570

(22) Filed: Jul. 18, 2011

(65) Prior Publication Data

US 2013/0021182 A1 Jan. 24, 2013

(51) Int. Cl.
*H03M 3/00* (2006.01)

(52) U.S. Cl. ........ 341/143; 341/118; 341/120; 341/155; 341/172

(58) Field of Classification Search ................. 341/118, 341/120, 143, 155, 15, 172
See application file for complete search history.

(56) References Cited

U.S. PATENT DOCUMENTS

| | | | | |
|---|---|---|---|---|
| 4,920,544 | A * | 4/1990 | Endo et al. ................ | 375/243 |
| 5,030,954 | A * | 7/1991 | Ribner .................... | 341/172 |
| 7,212,136 | B2 * | 5/2007 | Roza ...................... | 341/76 |
| 7,385,443 | B1 * | 6/2008 | Denison .................. | 330/9 |
| 7,508,330 | B1 * | 3/2009 | Chandra .................. | 341/143 |
| 7,567,194 | B2 * | 7/2009 | Hasegawa ................ | 341/143 |
| 7,683,815 | B2 * | 3/2010 | Josefsson et al. .......... | 341/143 |
| 2008/0272946 | A1 * | 11/2008 | Melanson ................ | 341/143 |
| 2008/0309536 | A1 * | 12/2008 | Le Guillou et al. ........ | 341/143 |
| 2010/0156686 | A1 * | 6/2010 | Kim et al. ............... | 341/143 |
| 2010/0219998 | A1 * | 9/2010 | Oliaei ..................... | 341/143 |
| 2010/0289682 | A1 * | 11/2010 | Groenewold .............. | 341/143 |
| 2010/0321064 | A1 * | 12/2010 | Mathe .................... | 326/59 |
| 2012/0038500 | A1 * | 2/2012 | Dijkmans et al. .......... | 341/143 |

OTHER PUBLICATIONS

Walt Kester, "ADC Architectures III: Sigma-Delta ADC Basics", MT-022 Tutorial, http://www.analog.com/static/imported-files/tutorials/MT-022.pdf, p. 1-12.

Scott Kulchycki, "Continuous-Time Sigma-Delta A/D Converters", © 2008, National Semiconductor Corporation, http://www.national.com/assets/en/appnotes/national_signalpathdesigner_CTSD.pdf, p. 1-6.

James A. Cherry and W. Martin Snelgrove, "Excess Loop Delay in Continuous-Time Delta-Sigma Modulators", IEEE Transactions on Circuits and Systems—II: Analog and Digital Signal Processing, vol. 46, No. 4, Apr. 1999, pp. 376-389.

* cited by examiner

*Primary Examiner* — Linh Nguyen

(74) *Attorney, Agent, or Firm* — John R. Pessetto; W. James Brady; Frederick J. Telecky, Jr.

(57) ABSTRACT

A continuous-time sigma-delta analog to digital converter (CTSD ADC) includes a comparator that samples the time integral of an analog signal at each rising edge and falling edge of a sampling clock. A feedback block, operating as a digital to analog converter, receives the outputs of the comparator and generates corresponding analog signals also at each rising and falling edge of the sampling clock. The feedback blocks are implemented as either switched-resistor or switched-current circuits. High signal-to-noise ratio (SNR) is achieved in the CTSD ADC without the need to use very high sampling clock frequencies. Compensation for excess loop delay is provided using a local feedback technique. In an embodiment, the sigma delta modulator in the CTSD ADC is implemented as a second order loop, and the comparator as a two-level comparator.

17 Claims, 8 Drawing Sheets

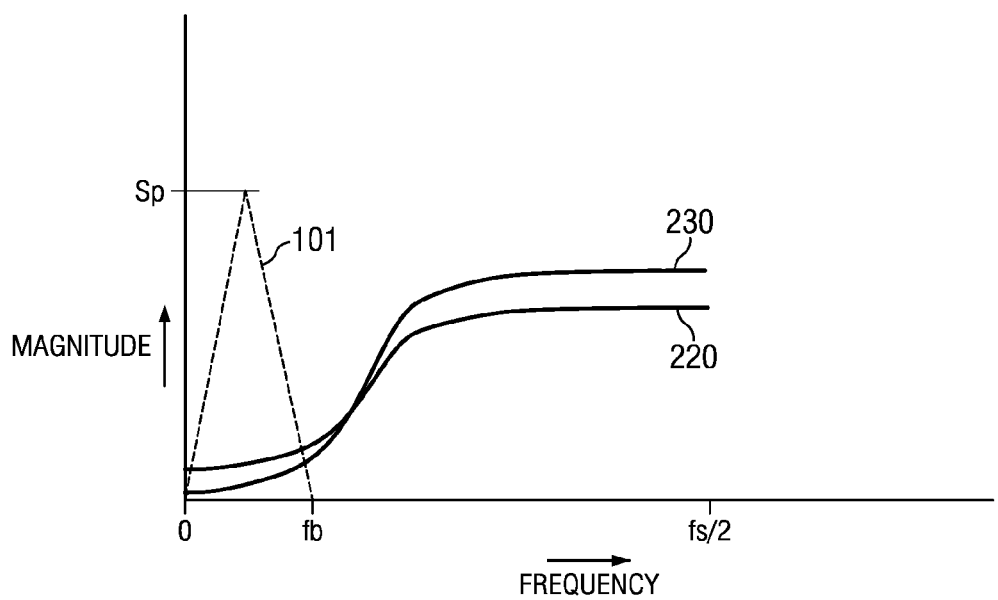
*FIG. 2A*
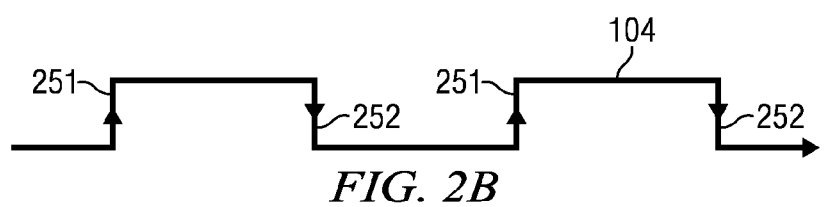
*FIG. 2B*
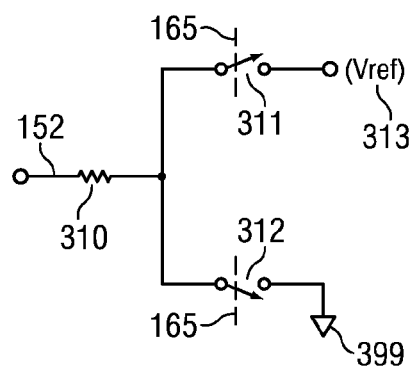         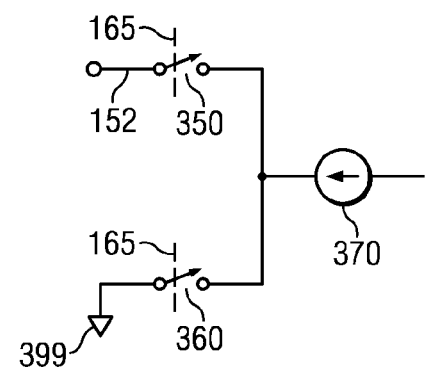
*FIG. 3A*            *FIG. 3B*

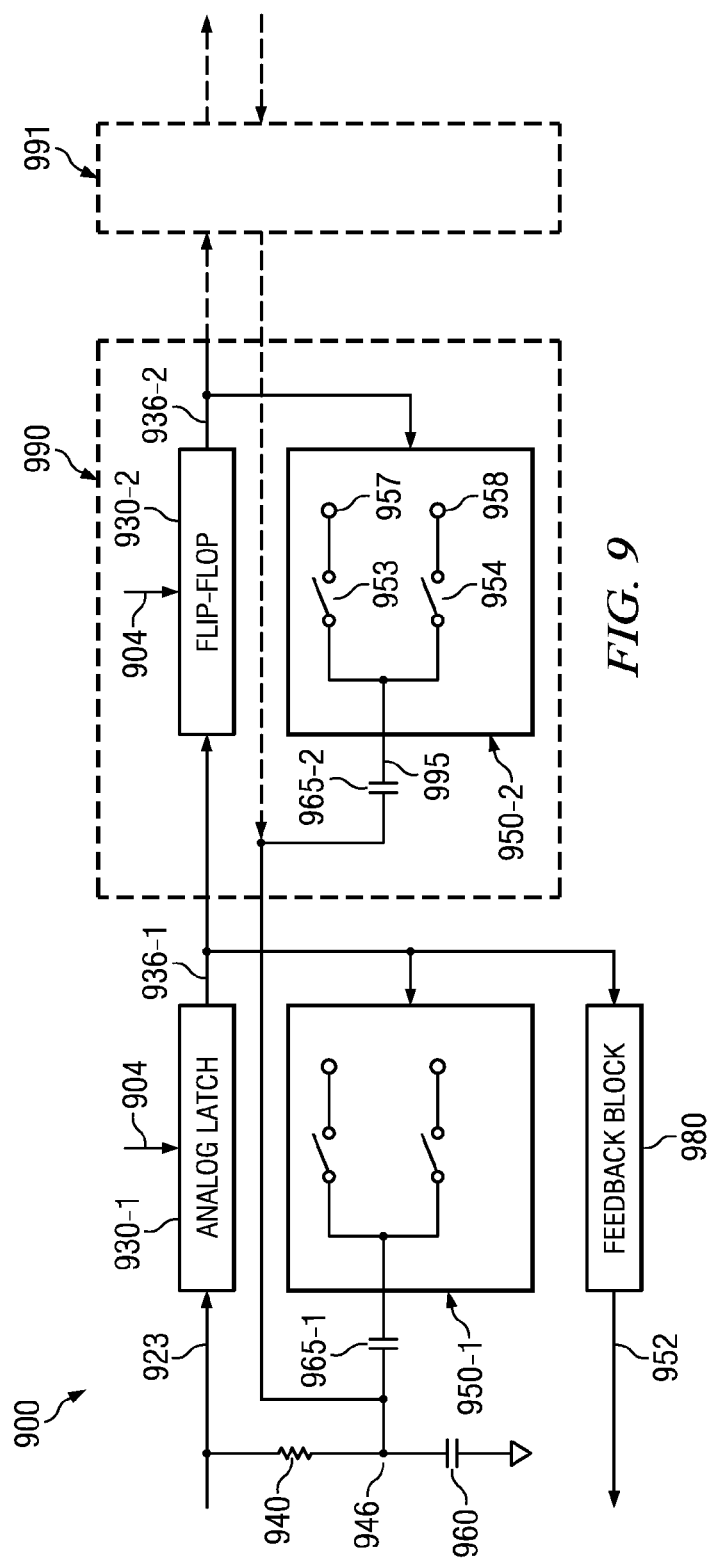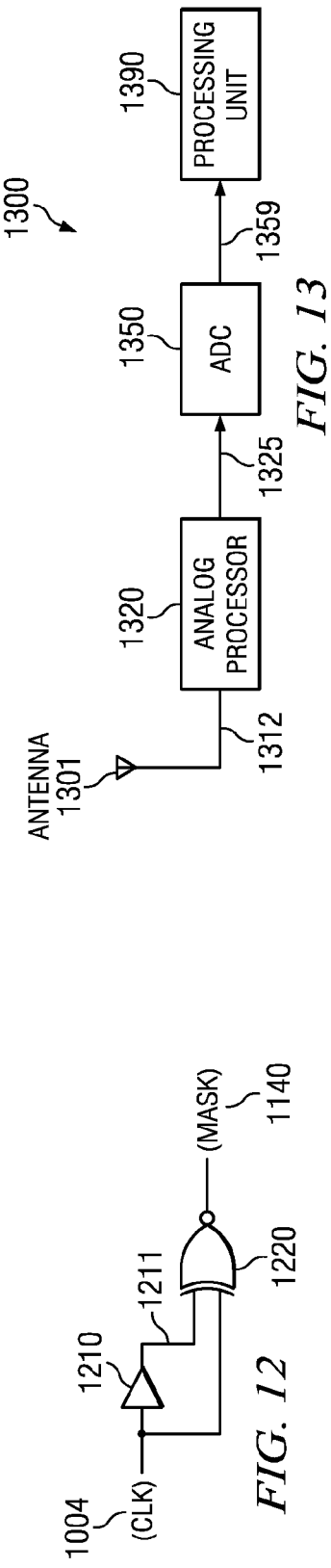

US 8,400,340 B2

ACHIEVING HIGH DYNAMIC RANGE IN A SIGMA DELTA ANALOG TO DIGITAL CONVERTER

BACKGROUND

1. Technical Field

Embodiments of the present disclosure relate generally to data converters, and more specifically to achieving high dynamic range in a sigma delta analog to digital converter.

2. Related Art

Analog to digital converters (ADC) are often implemented employing sigma delta (also termed delta sigma) modulation techniques. As is well known in the relevant arts, a sigma delta (SD) ADC is a type of ADC which includes a sigma delta modulator followed by a digital decimation filter. The sigma delta modulator receives an analog input signal which is sought to be represented in digital form, and generates a digital stream of noise-shaped output digital values corresponding to the analog input signal, each output digital value being represented either by a single bit or multiple bits. The sigma delta modulator uses closed-loop feedback to generate the output digital values, as is also well-known in the relevant arts. The digital decimation filter decimates (filtering/down-sampling of the output digital stream) to generate a final digital representation of the analog input signal.

Dynamic range with respect to a SD ADC generally refers to the ratio of the largest and smallest magnitudes of the analog input signal that the SD ADC can resolve and convert to digital form. Thus, dynamic range refers to the range between the noise floor of the SD ADC and the maximum output level the SD ADC can handle. Dynamic range may also be viewed as being correlated with the signal-to-noise-ratio (SNR) of the output of the SD ADC, a larger SNR corresponding to a larger dynamic range. A high dynamic range is usually desirable in a SD ADC. Further, such high dynamic range may need to be achieved or provided even when one or more design constraints are imposed on the design of the SD ADC.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A sigma-delta analog to digital converter (SD ADC) includes a sigma delta modulator (SD modulator) and a digital decimation filter. The SD modulator includes an integrator, a quantizer implemented as a comparator(s), a feedback block and a summing block. The integrator receives an input analog signal and generates a time integral of the error signal generated as a difference between the input analog signal and a feed-back signal. The comparator (a single-bit quantizer) converts the time integral to a corresponding binary value at each rising edge and falling edge of a sampling clock. The feedback block receives the corresponding binary value and generates the feedback signal representing the corresponding binary value. The summing block subtracts the feedback signal from the input analog signal. The feedback block is designed to employ switched-resistor or switched-current techniques, and to generate corresponding analog pulses at each rising edge and falling edge of the sampling clock.

Several embodiments of the present disclosure are described below with reference to examples for illustration. It should be understood that numerous specific details, relationships, and methods are set forth to provide a full understanding of the embodiments. One skilled in the relevant art, however, will readily recognize that the techniques can be practiced without one or more of the specific details, or with other methods, etc.

BRIEF DESCRIPTION OF THE VIEWS OF DRAWINGS

Example embodiments will be described with reference to the accompanying drawings briefly described below.

FIG. 2A is diagram illustrating signal and noise magnitudes with respect to frequency of a sigma delta (SD) modulator in an embodiment.

FIG. 2B is a diagram illustrating a sampling clock used in a SD modulator in an embodiment.

FIG. 3A is a circuit diagram illustrating the manner in which a feedback block is implemented as a switched-resistor (SR) circuit in an embodiment.

FIG. 3B is a circuit diagram illustrating the manner in which a feedback block is implemented as a switched-current (SI) circuit in an embodiment.

FIG. 9 is a diagram illustrating the manner in which compensation for excess loop delay is provided in yet another embodiment.

FIG. 12 is a diagram of a circuit used to generate a masking signal for use in preventing ELD in a SD modulator, in an embodiment.

FIG. 13 is a block diagram of an example system employing a SD ADC in an embodiment.

The drawing in which an element first appears is indicated by the leftmost digit(s) in the corresponding reference number.

DETAILED DESCRIPTION

Various embodiments are described below with several examples for illustration.

1. Sigma Delta Analog to Digital Converter

Figure 1:
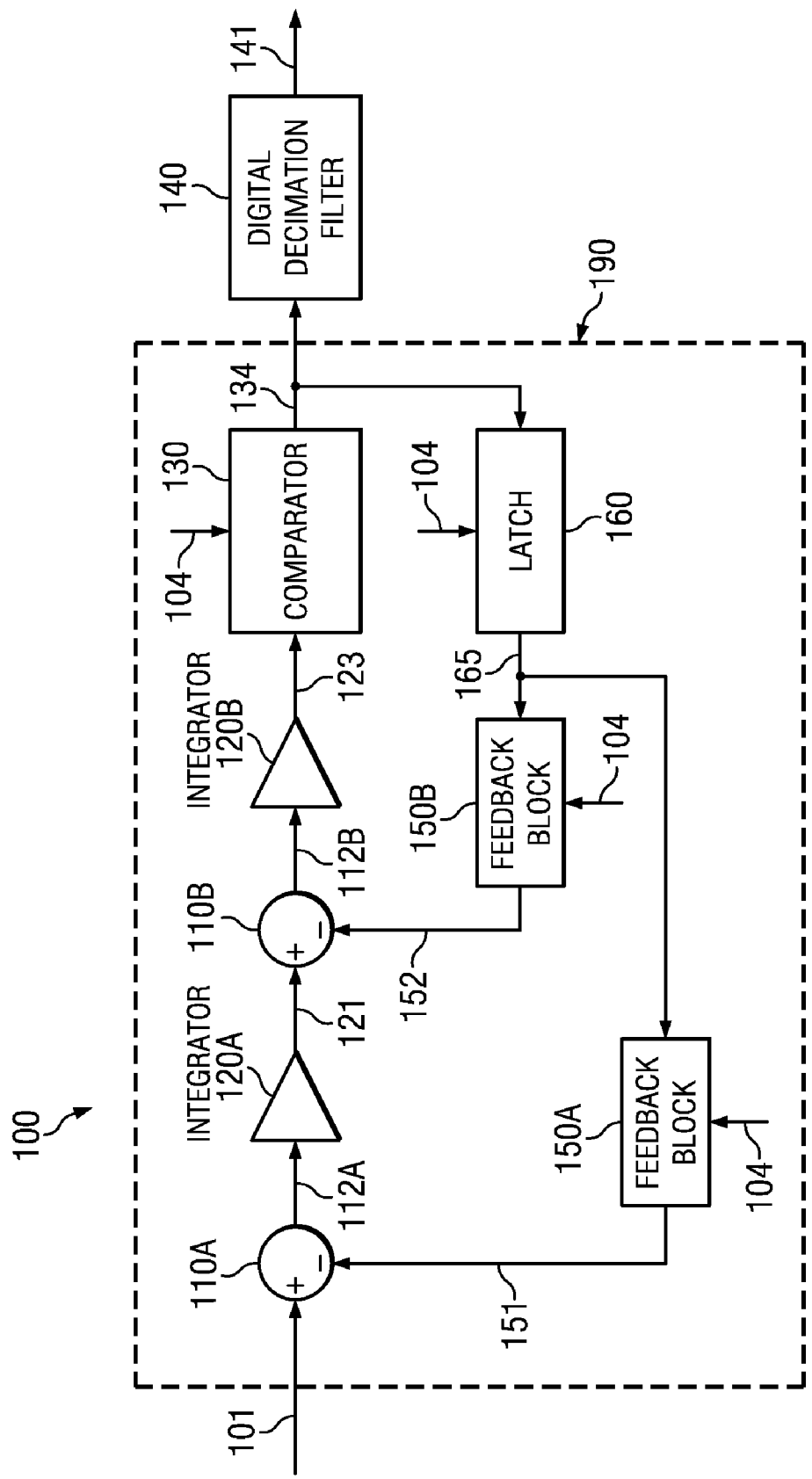
FIG. 1 is a block diagram illustrating the details of a sigma delta analog to digital controller (SD ADC) in an embodiment.

FIG. 1 is a block diagram of a sigma delta analog to digital converter (SD ADC) in an embodiment. SD ADC 100 is shown containing sigma delta modulator (SD modulator) 190 and digital decimation filter 140. SD modulator 190 receives an analog input signal on path 101, and generates a digital stream of noise-shaped output digital values on path 134. The output digital values 134 correspond to an oversampled input signal 101, the oversampling rate being typically much larger than the Nyquist rate, as is well known in the relevant arts. Digital decimation filter 140 decimates (down-samples to decrease the effective sampling rate) the digital stream on path 134 to generate a final digital output on path 141, the digital values on path 141 representing the input analog signal (101) in digital form. Although not shown in FIG. 1, analog input signal 101 may be filtered by an anti-aliasing filter prior to being provided as an input to summing block 110A.

In the embodiment shown in FIG. 1, SD modulator 190 is designed as a second-order modulator with a single-bit comparator, and is shown containing summing blocks (or summing junctions) 110A and 110B, integrators 120A and 120B, comparator 130, latch 160, and feedback blocks 150A and 150B. Input 101 may be received as a differential signal or a single-ended signal, depending on the specific implementation of SD modulator 190.

Summing block 110A subtracts output 151 of feedback block 150A from input signal 101. The difference generated by summing block 110A is provided on path 112A. Integrator 120A integrates the signal on path 112A to generate a time-integrated signal on path 121. Summing block 110B subtracts output 152 of feedback block 150B from signal 121. The difference generated by summing block 110B is provided on path 112B. Integrator 120B integrates the signal on path 112B to generate another time-integrated signal on path 123. The two integrators 120A and 120B, thus, determine the order of the feedback loop in SD modulator 190, which is thus a second-order loop.

It is noted that when SD modulator 190 is implemented to process differential signals, feedback blocks similar to blocks 150A and 150B (as well as other blocks as may be necessary to handle differential signals) may additionally be implemented within SD modulator 190.

In SD modulator 190, summing blocks 110A and 110B, integrators 120A and 120B, and 'parts' of each of feedback blocks 150A and 150B (which are typically digital to analog converters or DACs) operate in the analog domain. As described below, comparator 130, latch 160, and the corresponding 'parts' of feedback blocks 150A and 150B operate in the digital domain. SD ADC 100 of FIG. 1 is, thus, a continuous-time (CT) SD ADC.

Comparator 130 compares the magnitude of signal 123 against one or more pre-determined thresholds (programmed or designed internally) to generate digital values, on path 134, representing the comparison of signal 123 against the thresholds. In an embodiment, comparator 130 is implemented as a single-bit comparator, and generates binary values (logic ones and logic zeros) on path 134, the binary values representing a comparison result of signal 123 with a single threshold level. Thus, SD modulator 190 is a two-level modulator in the embodiment. Comparator 130 'samples' (or double-samples) signal 123 at each rising and falling edge of a sampling clock received on path 104. Thus, the comparison result 134 is generated at each rising and falling edge of sampling clock 104. Sampling clock 104 may have a frequency (fs) much higher than the Nyquist frequency (twice the highest frequency of interest) of signal 101. In an embodiment, the frequency of clock 104 is in the range 200 MHz to 300 MHz. It is noted that in other embodiments, comparator 130 may be designed to compare signal 123 against more than one threshold, and may thus be implemented as a multi-bit comparator.

Latch 160, which may be implemented as an analog latch, stores the digital outputs generated on path 134 at each rising and falling edge of clock 104. The stored value in latch 160 is provided as output on path 165. Analog latch 160 may be implemented to quantize small values of differential analog signals to digital logic levels, and may thus be designed to have a high resolution.

Each of feedback blocks 150A and 150B receives the stored output provided on path 165. Feedback block 150A converts the digital value received on path 165 to analog form, and the corresponding analog signal is provided on path 151. Feedback block 150B converts the digital value received on path 165 to analog form, and the corresponding analog signal is provided on path 152. Each of feedback blocks 150A and 150B generates the corresponding analog signals 151 and 152 corresponding to each value of signal 165 received, i.e., corresponding to each rising and falling edge of clock 104. Thus, each of feedback blocks 150A and 150B is clocked by clock 104 and performs double-sampling.

The dynamic range (DR) of SD ADC 100 is specified by Equation 1 below:

$$DR = \frac{3(L-1)^2(2O+1)OSR^{(2O+1)}}{2\pi^{2O}} \quad \text{Equation 1}$$

wherein,

O is the order of SD modulator 190,

L is the number of levels in comparator 130, and

OSR (over-sampling ratio) is the ratio of the sampling rate and the highest frequency of interest of analog input signal 101.

FIG. 2A is a diagram used to illustrate dynamic range of SD ADC 100. The band of frequencies from zero Hz (Hertz) to fb Hz represents an example bandwidth of interest of analog input signal 101. Curves 220 and 230 represent example noise levels (with respect to frequency) due to the operation of oversampling in SD modulator 190. Curve 220 may correspond to the noise when SD modulator 190 is implemented as a second order component, as in FIG. 1. Curve 230 may correspond to the noise when SD modulator 190 is implemented as a third-order (or higher-order then third-order) system. Dynamic range of SD ADC 100 is the ratio of peak signal level (Sp) and the integral of the noise from 0 Hz to fb Hz.

It may be observed from Equation 1 that dynamic range can be increased by increasing one or more of order (O), levels (L) and OSR. However, at least in some instances and/or environments, such increasing may not be desirable. For example, the system or device in which SD ADC 100 is used may either not provide clock 104 with a very high frequency, or the use of a high-frequency clock may incur a corresponding power penalty, complicate layout, clock routing and/or add to noise problems. Increasing the number of levels (L) in comparator 130 may not be desirable due to potential requirements of dynamic element matching design to compensate for component-mismatch, and/or other problems. Increasing the order (O) may degrade loop stability (of the closed loop in SD modulator 190), may worsen overload recovery of SD ADC 100, etc.

Hence, and as noted above, SD modulator 190 of FIG. 1 is implemented as a second-order loop with a single-bit comparator. Double-sampling, i.e., sampling at each rising and falling edge of clock 104 is employed in SD modulator 190 to 'increase' OSR without increasing clock frequency (fs) of clock 104. As illustrated in FIG. 2B, comparator 130 performs a comparison of the magnitude of signal 123 with an internal threshold, and generates a comparison result on path 134 at each rising edge (251) as well as falling edge (252) of clock 104. Latch 160 stores each of the comparison results at the corresponding time instances and for the corresponding time durations. Each of feedback blocks 150A and 150B generate analog values representing the output of comparator 130 (and thus output 165) at each rising edge (251) and falling edge (252) of clock 104.

Each of feedback blocks 150A and 150B may be implemented using switched-capacitor (SC), switched-current (SI) or switched-resistor (SR) techniques. SI technique refers to the use of circuits that switch a current (e.g., generated by a current source) to and from a node of interest in a circuit. SI technique refers to the use of circuits that connect and disconnect a current from a node of interest in a circuit, with the current being generated by connection of a resistor that is switched to connect to one of multiple potentials.

SC techniques may offer some advantages, in that such techniques may be fairly tolerant to clock jitter of clock 104 and also tolerant to deviations in the duty cycle of clock 104 from a value 50%, i.e., the use of SC techniques may support operation even if the duty cycle of clock 104 is different from 50%, such as for example 45% or 55%. However, implementation of feedback blocks 150A and 150B using SC techniques may not be desirable at least for some reasons. For example, SC techniques may call for the requirement of a high-bandwidth (and therefore high power-consumption) amplifier, which may not be desirable. Further, SC implementations may suffer from gain error. Accordingly, in embodiments of the present disclosure feedback blocks 150A and 150B are implemented using SI or SR techniques, as described further below.

2. Implementation of Feedback Blocks

FIG. 3A is a circuit diagram illustrating the manner in which a feedback block is implemented as a switched-resistor (SR) circuit in an embodiment. The circuit in FIG. 3A shows the relevant portions of feedback block 150B, and assumes single-ended operation of SD modulator 190. Switches 311 and 312 are controlled to be open or closed depending on the logic level of signal 165, as indicated in FIG. 3A. For one logic level (e.g., logic high) of signal 165, switch 311 is closed and switch 312 is open. As a result, a current equaling Vref/R310 (Vref being the voltage provided at node 313, and R310 being the resistance of resistor 310) flows into node 152 for the interval between the 'current' edge of clock 104 and the next edge. The 'current' edge is the edge that generated the logic level.

For the other logic level (e.g., logic low) of signal 165, switch 311 is open and switch 312 is closed. As a result, node 152 is connected to ground (399) for the corresponding duration (between the corresponding successive edges of clock 104). Feedback block 150A may be implemented in a manner similar to that of the circuit of FIG. 3A. Vref may be provided from an external source or generated internally in the respective feedback blocks.

When differential operation is desired, a replica of the circuit of FIG. 3A may be connected to one arm (e.g., positive arm) of signal 121, while the circuit of FIG. 3A may be connected to the other arm (e.g., negative arm). The corresponding switches of the circuits are controlled such that when a positive current is injected into one arm a negative current is injected into the other arm, and vice versa. In such a differential implementation positive and negative voltages (+Vref and −Vref respectively) may be generated within (or provided to) the respective feedback blocks.

FIG. 3B is a circuit diagram illustrating the manner in which a feedback block is implemented as an SI circuit in an embodiment. The circuit in FIG. 3B shows the relevant portions of feedback block 150B, and assumes single-ended operation of SD modulator 190. Feedback block 150A may be implemented in a similar manner. Switches 350 and 360 are controlled to be open or closed depending on the logic level of signal 165, as indicated in FIG. 3B. For one logic level (e.g., logic high) of signal 165, switch 351 is closed and switch 361 is open. As a result, a current 'I' generated by current source 370 flows into node 152 for the interval between the 'current' edge of clock 104 and the next edge. For the other logic level (e.g., logic low) of signal 165, switch 351 is open and switch 361 is closed. As a result, the current 'I' flows to ground for the corresponding duration (between the corresponding successive edges of clock 104). When differential operation is required, the circuit of FIG. 3B may be replicated and the two circuits may be operated to enable differential operation.

Figures 4, 5:
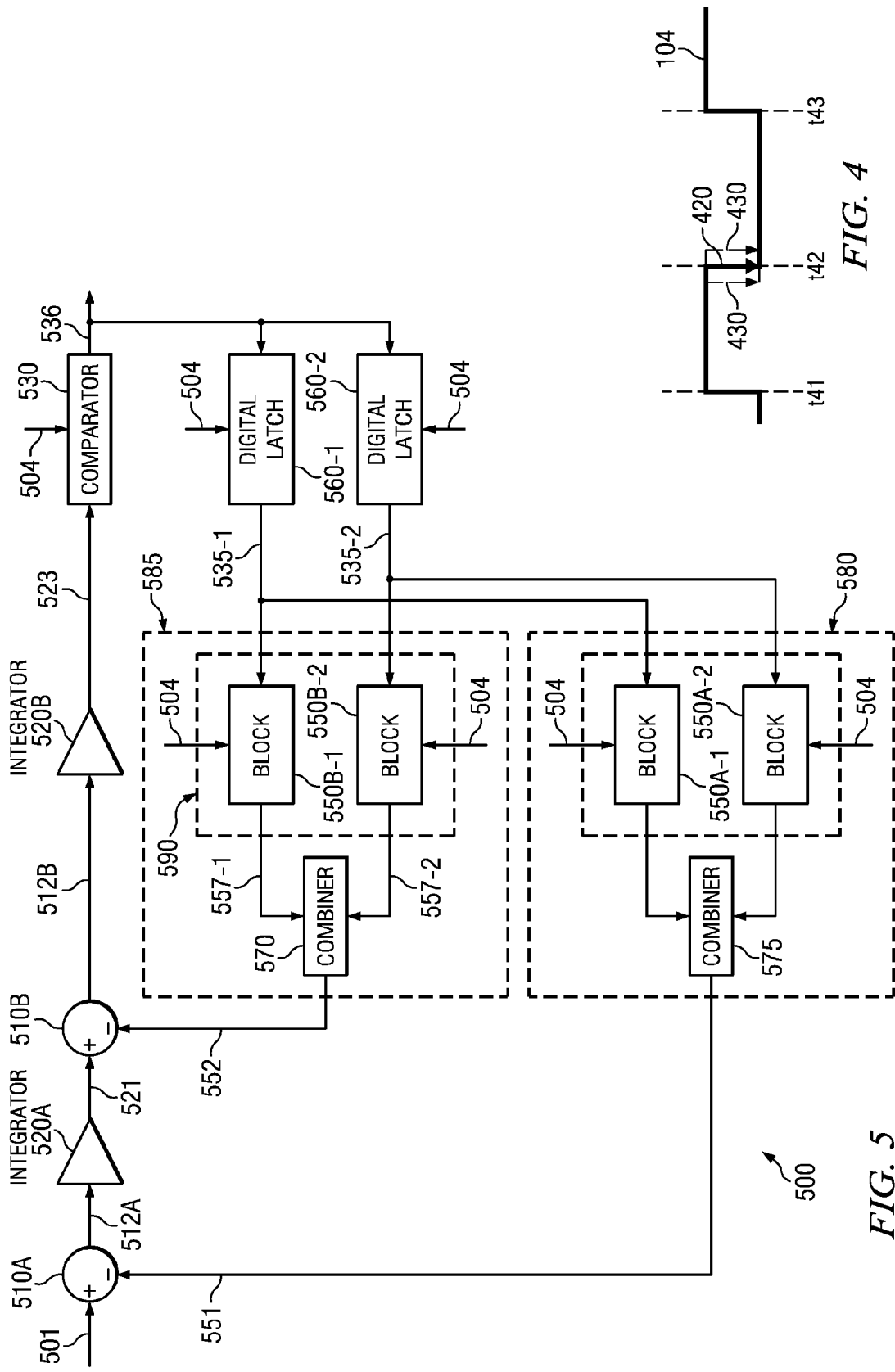
FIG. 4 is a diagram used to illustrate clock jitter and clock duty cycle of a sampling clock.
FIG. 5 is a block diagram of an SD modulator in which duty cycle sensitivity of SI or SR feedback is mitigated, in an embodiment.

One drawback with SR and SI circuits such as, for example, those illustrated with respect to FIGS. 3A and 3B, is that such circuits are sensitive to variations from 50% of the duty cycle of clock 104. Further, clock jitter of clock 104 may also adversely affect the overall operation of SD modulator 190 when SI or SR feedback is used. FIG. 4 shows an example of clock 104, and is used to illustrate clock jitter and non-50% duty cycle. When ON (or high) duration t41-t42 is not equal to OFF (or low) duration t42-t43, the duty cycle of clock 104 differs from 50%. Cycle-to-cycle variations in the time between occurrences of consecutive rising and/or falling edges of clock 104 may be referred to as jitter (specifically period jitter).

As shown in FIG. 4, falling edge of clock 104 may correspond to edges 410, 420 and 430 in different cycles of clock 104 resulting in jitter, the other portions of clock 104 assumed to remain unchanged for illustration. Clock jitter and non-50% duty cycle may degrade SNR (for example, of digital representation 141 of the analog input 101). The degradation in SNR for a 45% or 55% duty cycle of clock 104 may be of the order of 50 decibels (dB) to 23 dB. Such degradation occurs since the feedback 'energy' is a function of the duty cycle of clock 104. The manner in which such a problem is mitigated or overcome is described next.

3. Mitigating Duty Cycle Dependence

FIG. 5 is a block diagram illustrating the manner in which duty cycle sensitivity of SI or SR feedback is mitigated in an embodiment. FIG. 5 shows a second-order, two-level SD modulator 500, which is shown containing summing blocks 510A and 510B, integrators 520A (second integrator) and 520B (first integrator), comparator 530, digital latches 560-1 and 560-2, blocks 550B-1 and 550B-2, combiner 570, blocks 550A-1 and 550A-2 and combiner 575.

Summing blocks 510A (second summing block) and 510B (first summing block), integrators 520A and 520B, and comparator 530 operate similar to, and thus correspond to, summing blocks 110A and 110B, integrators 120A and 120B, and comparator 130 of FIG. 1 respectively, and their description is not repeated here in the interest of conciseness. Paths 501 (input analog signal), 512A (second difference signal), 521 (first analog signal), 512B (first difference signal), 523 (integrator output node), 551 (second analog pulse) and 552 (first analog pulse) correspond respectively to paths 101, 112A, 121, 112B, 123, 151 and 152. An analog input signal, which is sought to be converted to digital form, is received on path 501.

Each of digital latches 560-1 and 560-2 stores the (same) comparison output 536 of comparator 530 generated at each rising and falling edge of sampling clock 504. The stored outputs of latches 560-1 and 560-2 are provided respectively on paths 535-1 and 535-2. Block 590, containing blocks 550B-1 and 550B-2, corresponds to feedback block 150B of FIG. 1. However, unlike feedback block 150B, block 590 is designed to mitigate the sensitivity to the duty cycle and jitter of clock 504, as described below with respect to the waveforms of FIG. 6. Each of block 550B-1 and 550B-2 may be implemented as a switched-resistor (SR) circuit such as the circuit shown in FIG. 3A and described above. Alternatively, each of block 550B-1 and 550B-2 may be implemented as a switched-current (SI) circuit such as the circuit shown in FIG. 3B.

Combiner 570 adds the outputs of block 550B-1 and 550B-2 and provides the sum on path 552. The combination of blocks 550B-1 and 550B-2 and combiner 570 is referred to herein as block 585 (first feedback block). Block 580 is implemented similar or identical to block 585, with combiner 575, block 550A-1 and block 550A-2 being implemented identical to combiner 570, block 550B-1 and 550B-2 respectively.

Figure 6:
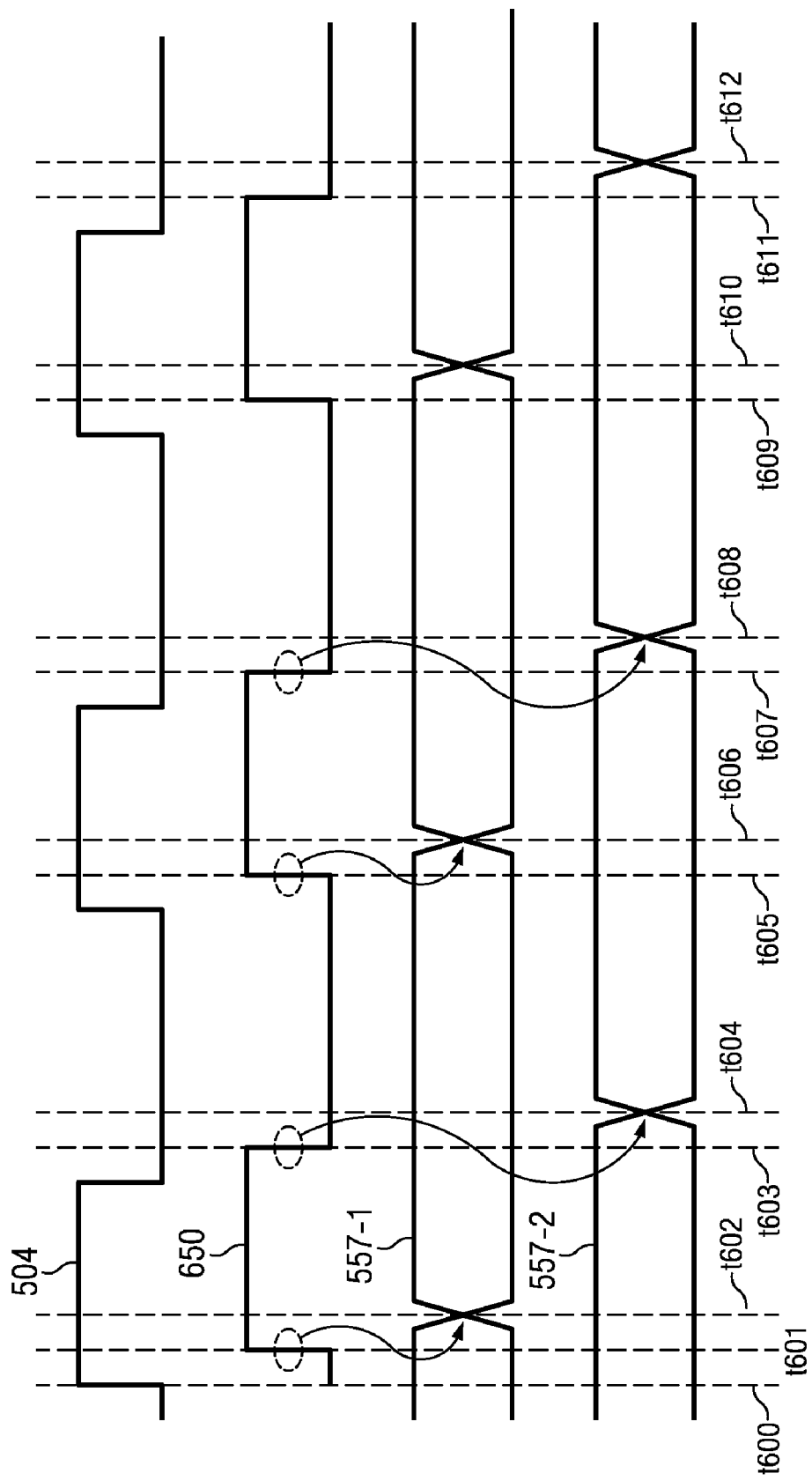
FIG. 6 is a diagram showing example timing waveforms of corresponding signals in a SD modulator, in an embodiment.

Clock 504 is shown in FIG. 6 with a non-50% duty cycle. Comparator 530 generates comparison outputs at the rising and falling edges of clock 504. The comparison outputs are latched by each of digital latches 560-1 and 560-2 after a slight delay. The rising and falling edges of waveform 650 represent the time instances at which the outputs of comparator 530 are latched by latches 560-1 and 560-2.

Block 550B-1 generates analog outputs representing digital outputs of digital latch 560-1 latched at rising edges of waveform 650, with each of the analog outputs being generated on path 557-1 (first set of analog pulses) for an interval equaling one clock period (and occurring between the corresponding successive rising edges) of clock 504. Thus, for example, assuming a logic high is provided on path 535-1 at time instance t601 and assuming block 550B-1 is implemented as an SI circuit (similar to the one shown in FIG. 3B), then block 550B-1 generates a current (I1) on path 557-1 for the duration t602 to t606. Block 550B-1 similarly generates the corresponding analog outputs for the intervals t606-t610, and so on, as illustrated in FIG. 6.

Block 550B-2 generates analog outputs representing digital outputs of digital latch 560-2 latched at falling edges of waveform 650, with each of the analog outputs being generated on path 557-2 (second set of analog pulses) for an interval equaling one clock period (and occurring between the corresponding successive falling edges) of clock 504. Thus, for example, assuming a logic high is provided on path 535-2 at time instance t602 and assuming block 550B-1 is implemented as and SI circuit (similar to as shown in FIG. 3B), then block 550-1 generates a current (I1) on path 557-2 for the duration t604 to t608. Block 550B-2 similarly generates the corresponding analog outputs for the intervals t608-t612, and so on, as illustrated in FIG. 6. The magnitude of current (I1) may be designed to equal half the current that would otherwise be generated if only one block were used (as for example in FIG. 1).

As a result of the implementation of feedback block 590 using two separate blocks which operate as described above, the adverse effect of duty cycle variations as well as clock jitter (described above with respect to FIG. 1) is mitigated. Feedback energy provided by feedback block 590 is rendered independent of duty cycle of clock 504. Block 580 operates similar to block 585, and the operation is not repeated here in the interest of conciseness.

One problem with the SD modulator 500 may be that the point (in time) of application of feedback by blocks 590 and 580 may be slightly later than the time instance at which the latched output of comparator 530 is provided. As an illustration, and referring to FIG. 6, latched output of digital latch 560-1 is generated at t601. However, block 550B-1 starts generating the corresponding analog output only at t602. Similarly, block 550B-2 starts generating the analog output corresponding to the digital value provided by latch 560-2 at t603 only at t604. The delay between the time instance of generation of latched data and the start of application of feedback is termed excess loop delay (ELD), and may result in the increase by one order (by creating a pole) in the closed loop transfer function representing SD modulator 500. The increase in order of the loop may lead to loop instability. The manner in which compensation for excess loop delay is provided in an embodiment is described next.

4. Excess Loop Delay Compensation

Figure 7:
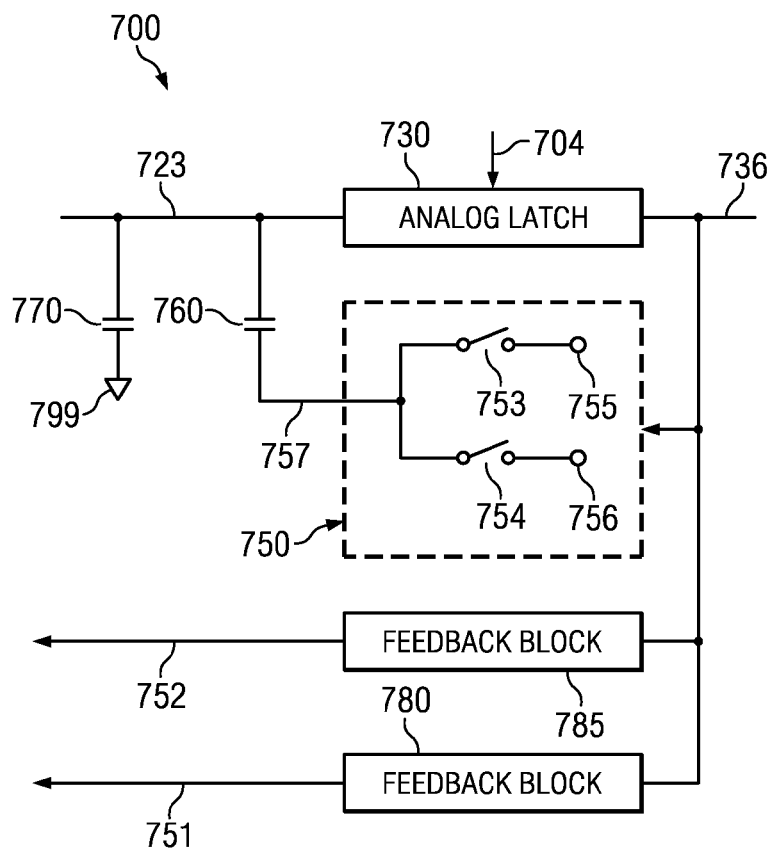
FIG. 7 is a diagram illustrating the manner in which compensation for excess loop delay (ELD) is provided in an embodiment.

FIG. 7 is a diagram illustrating the manner in which compensation for excess loop delay is provided in an embodiment. A portion of SD modulator 700 is shown in FIG. 7. FIG. 7 shows analog latch 730, circuit 750, feedback blocks 780 and 785, and capacitors 760 and 770. Although not shown in FIG. 7 in the interest of conciseness, SD modulator 700 is assumed to also contain integrators and summing blocks similar to those shown in FIG. 5, and with the same interconnections. Paths 723, 736 (first output node), 751 and 752 correspond respectively to paths 523, 536, 551 and 552 of FIG. 5. Nodes 755 and 756 of circuit 750 are respectively connected to a positive reference voltage (+Vref) and a negative reference voltage (−Vref). Terminal 799 represents a ground terminal.

Analog latch 730 (which operates as a comparator) receives the time-integrated output of an integrator (not shown, but corresponding to integrator 520B of FIG. 5) on path 723, and samples signal 723 at both rising and falling edges of clock 704. Depending on the specific binary value generated by analog latch 730 on path 736, circuit 750 (which operates as a digital to analog converter) operates to close one of switches 751 and 752. Thus, the corresponding one of switches 751 and 752 is closed at rising and falling edges of clock 704. Thus, for example, when a logic high (logic one) is generated on path 736, switch 751 is closed and switch 752 is opened, and a voltage +Vref is applied to capacitor 760 via node 756 (second output node). As a result, a voltage pulse of value (Vref*C1/Cint) is applied at node/path 723. When a logic low (logic zero) is generated on path 736, switch 751 is opened and switch 752 is closed, and a voltage −Vref is applied to capacitor 760 via node 756. As a result, a voltage pulse of value (−Vref*C1/Cint) is applied at node/path 723. The 'local' feedback of a portion of the output (736) compensates for excess loop delay. The combination of capacitor 760, capacitor 770 and circuit 750 may be viewed as a local feedback circuit.

It is noted that the use of +Vref and −Vref above corresponds to a differential implementation, and assumes path 723 is one of a pair of differential signal paths. Capacitors 770, 760 analog latch 730 and circuit 750 is replicated in such a differential implementation, with the corresponding connections to the second one of the differential paths. In a single-ended implementation, Vref and ground (instead of +Vref and −Vref) are provided respectively at nodes 755 and 756.

Capacitor 770 (first capacitor) is implemented to have a capacitance equal to (Cint-C1), and capacitor 760 (second capacitor) is implemented to have a capacitance C1. In the forward direction, the effective capacitance is (Cint-C1+C1), which equals Cint. Hence, the transfer function of SD modulator 700 is not affected. Further, the ELD compensation is provided using passive components (capacitor 760) and a simple DAC structure (circuit 750). As a result, the implementation area as well as power consumption to provide the compensation are minimized.

Although, the techniques and circuits for ELD compensation above are described in the context of a SD modulator, it may be appreciated that the compensation technique is generic and can be applied in other contexts, environments and devices also.

Figure 8:
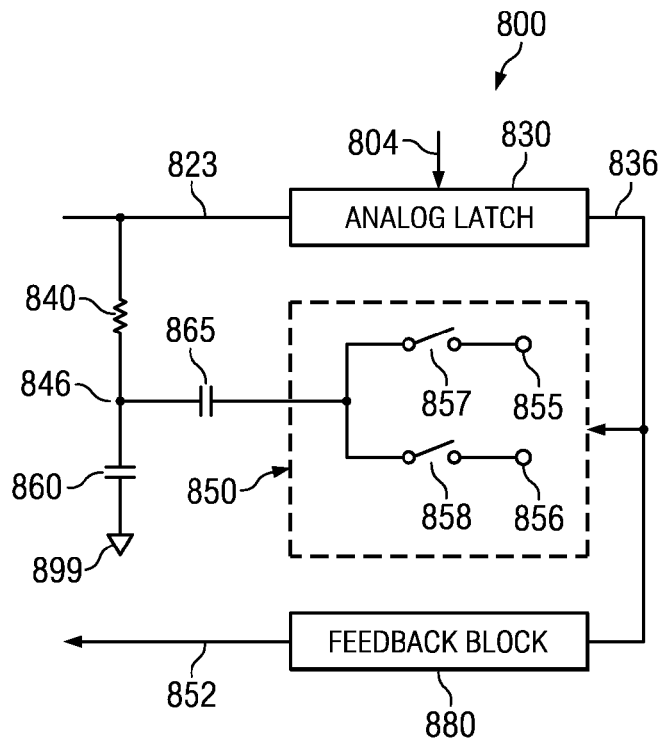
FIG. 8 is a diagram illustrating the manner in which compensation for excess loop delay is provided in an alternative embodiment.

FIG. 8 is a diagram illustrating the manner in which ELD compensation is provided in an alternative embodiment. A portion of SD modulator 800 is shown in FIG. 8. FIG. 8 shows analog latch 830, circuit 850, feedback block 880, resistor 840 and capacitors 860 and 865. Although not shown in FIG. 8 in the interest of conciseness, SD modulator 800 also contains two integrators (similar and corresponding to integrators 520A and 520B) and one summing block (corresponding to summing block 510B). Paths 823, 836, and 852 correspond respectively to paths 523, 536, and 552 of FIG. 5. Nodes 855 and 856 of circuit 850 are respectively connected to a positive reference voltage (+Vref) and a negative reference voltage (−Vref). Terminal 899 represents a ground terminal. Capacitors 860 (third capacitor) and 865 (fourth capacitor) are implemented respectively with capacitance values of (Cint− C1) and C1. Block 880 can correspond to either block 580 or block 585 of FIG. 5.

Analog latch 830 (which operates as a comparator) receives the time-integrated output of an integrator (not shown, but corresponding to integrator 520B of FIG. 5) on path 823, and samples signal 823 at both rising and falling edges of clock 804. Depending on the specific binary value generated by analog latch 830 on path 836, circuit 850 (which may be viewed as operating as a digital to analog converter) operates to close one of switches 857 and 858. Thus, the corresponding one of switches 857 and 858 is closed at every rising and falling edge of clock 804. Thus, for example, when a logic high (logic one) is generated on path 836, switch 857 is closed and switch 858 is opened, and a voltage +Vref is applied to capacitor 860. As a result, a corresponding voltage pulse of magnitude [+(C1/Cint)*Vref] is applied at node/path 846, wherein '*' represents a multiplication operation. Node 846 is, thus, the node at which ELD compensation is applied. When a logic low (logic zero) is generated on path 836, switch 857 is opened and switch 858 is closed, and a voltage −Vref is applied to capacitor 860. As a result, a voltage pulse of magnitude [−(C1/Cint)*−Vref] is applied at node/path 846. The local feedback of a portion of the output (836) compensates for excess loop delay.

The RC combination of resistor 840 and capacitor 860 generates a zero in the closed loop transfer function of SD modulator 800. Therefore, only one feedback block (feedback block 880) is required to ensure stability of the loop. Thus, while SD modulator 800 is implemented as a second-order loop, with two integrators (corresponding to integrators 520A and 520B of FIG. 5), only one feedback block is implemented, with the RC combination of resistor 840 and capacitor 860 implemented to ensure stability of the second-order loop. Again, the use of +Vref and −Vref in circuit 850 corresponds to a differential implementation. In a single-ended implementation, Vref and ground (instead of +Vref and −Vref) are provided respectively at nodes 855 and 856.

FIG. 9 is a diagram illustrating the manner in which ELD compensation is provided in yet another embodiment. Again, only the relevant portions of SD modulator 900 are shown in FIG. 9, with the integrators and summing blocks assumed to be present and connected similar to that shown in FIG. 5. Paths 923, 936-1 and 952 correspond respectively to paths 523, 536, and 552 of FIG. 5. Resistor 940, capacitor 965-1 and circuit 950-1 operate similarly as described above with respect to resistor 840, capacitor 860, capacitor 865 and circuit 850, and the description is not repeated here in the interest of conciseness. Again, assuming differential operation, nodes 957 and 958 respectively receive voltages +Vref and −Vref. ELD compensation is applied at node 946.

Analog latch 930-1 receives the time-integrated output of an integrator (not shown, but corresponding to integrator 520B of FIG. 5) on path 923, and samples signal 923 at both rising and falling edges of clock 904. Flip-flop 930-2 (second comparator) samples signal 936-1 also at both rising and falling edges of clock 904. Thus, output 936-2 of flip-flop 930-2 follows (equals) output 936-1, but with one clock-period delay of clock 904.

Circuit 950-2 (second analog to digital converter) operates to close one of switches 953 and 954 at each rising and falling edge of clock 904, based on the logic level of signal 936-2. Thus, for example, when a logic high is generated on path 936-2, switch 953 is closed and switch 954 is opened, and a voltage +Vref is applied to capacitor 965-2 (fifth capacitor) via node 995 (third output node). When a logic low is generated on path 936-2, switch 953 is opened and switch 954 is closed, and a voltage −Vref is applied to capacitor 965-2. The connection of capacitor 965-2 to either +Vref or −Vref results in a corresponding voltage pulse being applied at node 946.

One or more blocks/circuits (one such block 991 is shown in FIG. 9) identical to circuit 990 (delayed feedback block) may be implemented to process successively clock-delayed versions of signal 936-2 in a similar manner, with the feedback of each such circuit being applied at node 946. The resulting local feedback implements a 'polynomial' feedback of the form $[1+az^{1}+bz^{-2}+cz^{-3} \ldots nz^{-m}]$, wherein coefficients 'a' through 'n' are implemented by corresponding capacitors, coefficient 'a' being determined by capacitor 965-1. 'z' in the polynomial noted above represents a complex number according to the Z-transform.

Referring to FIG. 6, the rising and falling edges of waveform 650 represent the time instances at which the output of comparator 530 is latched by latches 560-1 and 560-2. Time interval t600-t601 represents the clock-edge-to-latch delay (Td). Block 550B-1 starts generating the corresponding analog output after a further delay (Tc, equal, for example, to interval t601-t602) from a rising edge of waveform 650. Block 550B-2 starts generating the corresponding analog output also after a delay Tc from a falling edge of waveform 650. As a result the outputs of each of blocks 550B-1 and 550B-2 extend into a next clock cycle. For example, output 557-1 generated starting from t602 changes only at t606, and thus extends beyond the next rising edge of clock 504, thereby potentially resulting in reduced stability margin and hence higher noise.

Figure 10:
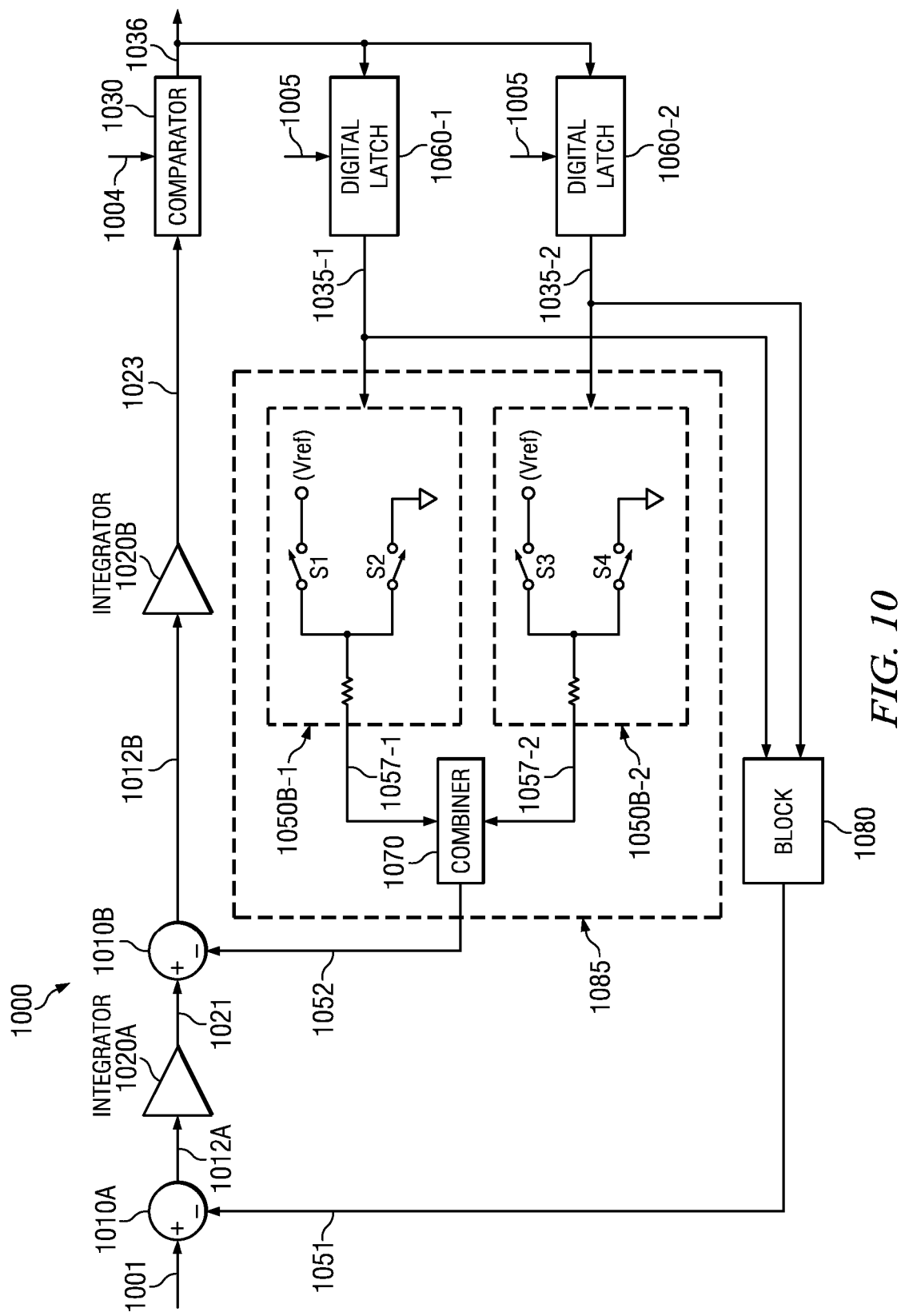
FIG. 10 is a block diagram of a SD modulator in which ELD is prevented, in an embodiment.

In yet another embodiment (SD modulator 1000) shown in FIG. 10, masking signals are generated to prevent the outputs generated by feedback blocks from extending into a next cycle, thereby avoiding ELD. Summing blocks 1010A and 1010B, integrators 1020A (second integrator) and 1020B (first integrator), comparator 1030, digital latches 1060-1 and 1060-2, blocks 1050B-1 and 1050B-2, combiner 1070 and block 1080 of FIG. 10 correspond respectively to (and may be implemented identical to) summing blocks 510A and 510B, integrators 520A (second integrator) and 520B (first integrator), comparator 530, digital latches 560-1 and 560-2, blocks 550B-1 and 550B-2, combiner 570 and block 580 of FIG. 5. Block 1080 is implemented identical to block 1085. Signals 1012A, 1021, 1012B, 1023, 1036, 1052 and 1051 correspond respectively to signals 512A, 521, 512B, 523, 536, 552 and 551 of FIG. 5. Signal 1001 represents an analog input to be converted to digital form. Binary values generated on path 1036 are processed by a digital decimation filter similar to that of FIG. 1.

Blocks 1050B-1 and 1050B-2 of feedback block 1085 are shown implemented as switched-resistor (SR) circuits, but can be implemented as SI circuits as well. The operation of masking the outputs 1057-1 and 1057-2 of respective blocks 1050B-1 and 1050B-2 to prevent these outputs from extending into a next cycle is illustrated with respect to the timing diagram of FIG. 11.

Figure 11:
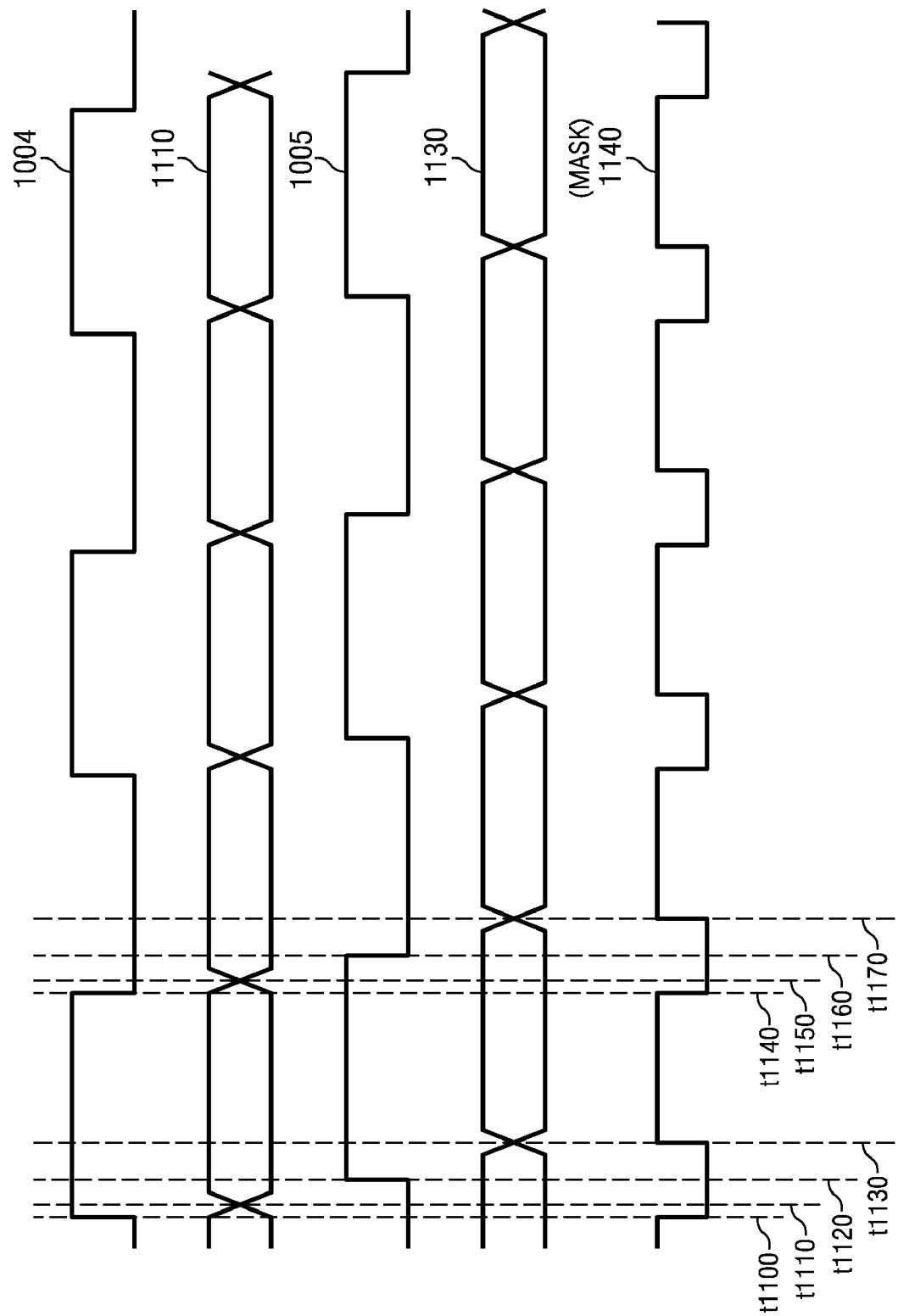
FIG. 11 is an example timing diagram illustrating the manner in which ELD is prevented in a SD modulator.

Example cycles of sampling clock 1004 used by comparator 1030 to sample signal 1023 are shown in FIG. 11. Waveform 1110 represents the output 1036 of comparator 1030. It may be observed that there is a time delay between edges of clock 1004 and the instants at which data 1036 become valid. Such delay is indicated in FIG. 11 by time intervals such as t1100-t1110 and t1140-t1150, these time intervals typically being equal. Clock 1005 provided to digital latches 1060-1 and 1060-2 is a delayed version of clock 1004, the delay being intentionally provided to account for comparator delay and setup time of digital latches 1060-1 and 1060-2. In FIG. 11, intervals t1100-t1120 and t1140-t1160 represent such a delay.

Waveform 1130 represents the outputs 1035-1 and 1035-2 of respective digital latches 1060-1 and 1060-2. Again, it may be observed that there is a time delay (example delay intervals t1120-t1130 and t1160-t1170 are shown in FIG. 11) between edges of clock 1005 and the instants at which outputs 1035-1 and 1035-2 become valid. Thus, outputs 1035-1 and 1035-2 extend beyond the corresponding 'feedback intervals' by a duration t1100-t1130 (or t1140-t1170). Signal 1140 is generated to be a logic zero in such intervals, as may be observed from FIG. 11, and is used to mask the outputs of blocks 1050B-1 and 1050B-2, as well as corresponding blocks (not shown) of feedback block 1080.

Signal 1140 (MASK) is used to mask the outputs of blocks 1050B-1 and 1050B-2, as well as the corresponding blocks (not shown) of feedback block 1080, thereby preventing ELD. FIG. 12 shows a circuit used to generate MASK (1140). Exclusive-NOR (XNOR) gate 1220 receives CLK (1004) and delayed signal 1211 as inputs, and generates a logical XNOR output as MASK 1140. Signal 1211 is a delayed version of CLK 1004. The delay introduced by delay element 1210 is slightly longer than and envelops (encompasses) the interval t1100-t1130 (or t1140-t1170).

Immediately following each rising edge of clock 1004, and for the duration of logic low value of MASK (1140), neither of switches S1 and S2 is operated (i.e., operated to be closed), thereby masking output 1057-1 of block 1050B-1. Once MASK (1140) switches to logic high, the corresponding one of switches S1 and S2 is closed, i.e., S1 is closed if signal 1035-1 is a logic high, while S2 is closed if signal 1035-1 is a logic low. Similarly, immediately following each falling edge of clock 1004, and for the duration of logic low value of MASK (1140), neither of switches S3 and S4 is closed, thereby masking output 1057-2 of block 1050B-2. Once MASK (1140) switches to logic high, the corresponding one of switches S3 and S4 is closed, i.e., S3 is closed if signal 1035-2 is a logic high, while S4 is closed if signal 1035-2 is a logic low.

The internal operation of switches in block 1080 is similar to that described above, and the description is not repeated here in the interest of conciseness. Thus, the outputs of the feedback blocks are masked in intervals straddling the rising and falling edges of the sampling clock to prevent the corresponding outputs from extending into a next cycle of the sampling clock.

It is noted here that the use of the same signal MASK (1140) to mask the outputs of both blocks 1050B-1 and 1050B-2 prevents any errors due to mismatch, which may otherwise occur if separate masking signals were used. The outputs of blocks 1050B-1 and 1050B-2 may be correspondingly increased in strength (for example by using an increased value of Vref) to adjust for the reduction in duration of application of the outputs (otherwise for a duration equal to one sampling clock period) due to masking.

The techniques described in detail above may be associated with several benefits. For example, a relatively low-frequency sampling clock may be used, thereby reducing power consumption and simplifying clock routing. The design of a SD modulator, and therefore a SD ADC is simplified due to the lower order (second order) and the use of only two comparator (or analog-latch) output levels.

A SD ADC implemented as described above can be incorporated as part of a larger system. The description is continued with reference to such an example system.

5. Example System

FIG. 13 is a block diagram of an example receiver system 1300. Receiver system 1300 may correspond to receivers such as a Global Positioning System (GPS) receiver, communication receivers such as an FM (frequency modulation) receiver, etc. Receiver system 1300 is shown containing antenna 1301, analog processor 1320, ADC 1350, and processing unit 1390.

Antenna 1301 may receive various signals transmitted on a wireless medium. The received signals may be provided to analog processor 1320 on path 1312 for further processing. Analog processor 1320 may perform tasks such as amplification (or attenuation as desired), filtering, frequency conversion, etc., on the received signals and provides the resulting processed signal on path 1325.

ADC 1350 converts the analog signal received on path 1325 to corresponding digital values, which are provided on path 1359 for further processing. ADC 1350 may be implemented as a SD ADC according to techniques described in detail above. Processing unit 1390 receives the data values on path 1359, and processes the data values to provide various user applications.

While in the illustrations of FIGS. 1, 5, 7, 8, 9 and 10, although terminals/nodes are shown with direct connections to various other terminals, it should be appreciated that additional components (as suited for the specific environment) may also be present in the path, and accordingly the connections may be viewed as being electrically coupled to the same connected terminals. In the instant application, power and ground terminals are referred to as constant reference potentials. Further, even though the description of above is provided with reference to single-ended circuits, the approaches described above can be extended to differential circuits, as will be apparent to one skilled in the relevant arts by reading the disclosure provided herein.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A sigma-delta analog to digital converter (SD ADC) comprising a sigma delta modulator (SD modulator), wherein the SD modulator comprises:

a first integrator to generate a time integral of a first difference signal at an integrator output node;

a comparator to convert the time integral to a corresponding binary value at each rising edge and falling edge of a sampling clock;

a first feedback block to receive the corresponding binary value and to generate a first analog pulse representing the corresponding binary value; and a first summing block to subtract the first analog pulse from a first analog signal to generate the first difference signal, wherein the first feedback block comprises a first switched-resistor circuit and a second switched-resistor circuit, wherein the first switched-resistor circuit is operable to generate a first set of analog pulses, each of a constant magnitude and a duration equal to one period of the sampling clock, in each of an interval between successive rising edges of the sampling clock, an analog pulse in the first set being generated with a first voltage if the corresponding binary value has a first logic level, the analog pulse in the first set being generated with a second voltage if the corresponding binary value has a second logic level, and wherein the second switched-resistor circuit is operable to generate a second set of analog pulses, each of a constant magnitude and a duration equal to one period of the sampling clock, in each of an interval between successive falling edges of the sampling clock, an analog pulse in the second set being generated with the first voltage if the corresponding binary value has a first logic level, the analog pulse in the second set being generated with the second voltage if the corresponding binary value has a second logic level, wherein the first analog pulse is a sum of the corresponding analog pulse in the first set of analog pulses and the corresponding analog pulse in the second set of analog pulses.

2. The SD ADC of claim 1, wherein the first feedback block further comprises a combiner to add corresponding pulses in the first set of analog pulses and the second set of analog pulses to generate the first analog pulse.

3. A sigma-delta analog to digital converter (SD ADC) comprising a sigma delta modulator (SD modulator), wherein the SD modulator comprises:

a first integrator to generate a time integral of a first difference signal at an integrator output node;

a comparator to convert the time integral to a corresponding binary value at each rising edge and falling edge of a sampling clock;

a first feedback block to receive the corresponding binary value and to generate a first analog pulse representing the corresponding binary value; and a first summing block to subtract the first analog pulse from a first analog signal to generate the first difference signal, wherein the first feedback block comprises a first switched-current circuit and a second switched-current circuit, wherein the first switched-current circuit is operable to generate a first set of currents, each of a constant magnitude and a duration equal to one period of the sampling clock, in each of an interval between successive rising edges of the sampling clock, a current in the first set of currents being generated with a first magnitude if the corresponding binary value has a first logic level, the current in the first set of currents being generated with a second magnitude if the corresponding binary value has a second logic level, and wherein the second switched-current circuit is operable to generate a second set of currents, each of a constant magnitude and a duration equal to one period of the sampling clock, in each of an interval between successive falling edges of the sampling clock, a current in the second set of currents being generated with the first magnitude if the corresponding binary value has the first logic level, the current in the second set of currents being generated with the second magnitude if the corresponding binary value has the second logic level, wherein the first analog pulse is a sum of the corresponding current value in the first set of currents and the corresponding current value in the second set of currents.

4. The SD ADC of claim 3, wherein the first feedback block further comprises a combiner to add corresponding currents in the first set of currents and the second set of currents to generate the first analog pulse.

5. The SD ADC of claim 2, wherein the SD modulator further comprises:

a second integrator to generate a time integral of a second difference signal;

a second feedback block to receive the corresponding binary value and to generate a second analog pulse representing the corresponding binary value; and a second summing block to subtract the second analog pulse from an input analog signal to generate the second difference signal, wherein the second feedback block is also designed to employ switched-resistor or switched-current techniques, and to generate corresponding analog pulses at each rising edge and falling edge of the sampling clock.

6. The SD ADC of claim 5, wherein the second feedback block is implemented identical to the first feedback block.

7. The SD ADC of claim 6, further comprising a digital decimation filter to down-sample a digital stream generated by the comparator on a first output node of the comparator, and to generate a final digital stream representing the first analog signal in digital form.

8. The SD ADC of claim 5, wherein the SD modulator further comprises a local feedback circuit comprising:

a digital to analog converter coupled to the first output node, the digital to analog converter operable at each rising edge and falling edge of the sampling clock to generate, on a second output node, one of two voltages based on the corresponding binary value at the first output node;

a first capacitor coupled between the integrator output node and a constant reference potential; and a second capacitor coupled between the integrator output node and the second output node.

9. The SD ADC of claim 2, wherein the SD modulator further comprises:

a second integrator to generate a time integral of an input analog signal as the first analog signal;

a first digital to analog converter coupled to a first output node of the comparator, the first digital to analog converter operable at each rising edge and falling edge of the sampling clock to generate, on a second output node, one of two voltages based on the corresponding binary value at the output node;

a series arrangement of a third capacitor and a resistor, the first series arrangement coupled between the integrator output node and a constant reference potential, the first capacitor being connected to the resistor at a junction node; and a fourth capacitor coupled between the second output node and the junction node.

10. The SD ADC of claim 9, wherein the SD modulator further comprises:

a second comparator to delay the corresponding binary value by one clock cycle of the sampling clock to generate a delayed binary value;

a second digital to analog converter coupled to receive the delayed binary value, the second digital to analog converter operable at each rising edge and falling edge of the sampling clock to generate, on a third output node, one of two voltages based on the delayed binary value; and a fifth capacitor coupled between the third output node and the junction node, wherein the second comparator, the second digital to analog converter and the fifth capacitor form a delayed feedback block.

11. The SD ADC of claim 10, wherein the SD modulator further comprises a plurality of blocks implemented identical to the delayed feedback block, comparators in successive blocks in the plurality of blocks to generate corresponding successively delayed binary values, digital to analog converters in successive blocks in the plurality of blocks coupled to the junction node via corresponding capacitors and generating corresponding voltages, wherein the combination of the comparator, the first analog to digital converter, the series arrangement of the third capacitor and the resistor, the fourth capacitor, the delayed feedback block and the plurality of blocks implements a feedback having a polynomial form.

12. The SD ADC of claim 6, wherein pulses in the first set of analog pulses and the second set of analog pulses are masked in intervals straddling the rising and falling edges of the sampling clock to prevent the corresponding pulses from extending into corresponding cycles of the sampling clock.

13. A sigma-delta modulator (SD modulator) comprising:
a first integrator to generate a time integral of a first difference signal at an integrator output node;
a comparator to convert the time integral to a corresponding binary value at each rising edge and falling edge of a sampling clock, the corresponding binary value being provided on a first output node of the comparator;
a first feedback block to receive the corresponding binary value and to generate a first feedback signal representing the corresponding binary value;
a first summing block to subtract the first feedback signal from a first analog signal to generate the first difference signal;
a second integrator to generate a time integral of a second difference signal;
a second feedback block to receive the corresponding binary value and to generate a second feedback signal representing the corresponding binary value; and
a second summing block to subtract the second feedback signal from an input analog signal to generate the second difference signal;
a local feedback circuit, the local feedback circuit comprising:
a digital to analog converter coupled to the first output node, the digital to analog converter operable at each rising edge and falling edge of the sampling clock to generate, on a second output node, one of two voltages based on the corresponding binary value at the first output node;
a first capacitor coupled between the integrator output node and a constant reference potential; and
a second capacitor coupled between the integrator output node and the second output node;
wherein at least one of the first feedback block and the second feedback block is designed to employ switched-resistor or switched-current techniques, and wherein each of the first feedback block and the second feedback block is designed to generate corresponding feedback signals at each rising edge and falling edge of the sampling clock.

14. A system comprising:
an antenna to receive a signal on a wireless medium;
an analog processor to process the signal and to generate a processed signal;
a sigma delta analog to digital converter (SD ADC) to receive the processed signal as input and to generate a plurality of digital values representing the processed signal; and
a processor to process the plurality of digital values,
wherein the SD ADC comprises a sigma delta modulator (SD modulator), wherein the SD modulator comprises:
a first integrator to generate a time integral of a first difference signal at an integrator output node;
a comparator to convert the time integral to a corresponding binary value at each rising edge and falling edge of a sampling clock, the corresponding binary value being provided on a first output node of the comparator;
a first feedback block to receive the corresponding binary value and to generate a first feedback signal representing the corresponding binary value;
a first summing block to subtract the first feedback signal from a first analog signal to generate the first difference signal;
a second integrator to generate a time integral of a second difference signal;
a second feedback block to receive the corresponding binary value and to generate a second feedback signal representing the corresponding binary value; and
a second summing block to subtract the second feedback signal from the processed signal to generate the second difference signal,
a local feedback circuit, the local feedback circuit comprising:
a digital to analog converter coupled to the first output node, the digital to analog converter operable at each rising edge and falling edge of the sampling clock to generate, on a second output node, one of two voltages based on the corresponding binary value at the first output node;
a first capacitor coupled between the integrator output node and a constant reference potential; and
a second capacitor coupled between the integrator output node and the second output node,
wherein at least one of the first feedback block and the second feedback block is designed to employ switched-resistor or switched-current techniques, and
wherein each of the first feedback block and the second feedback block is designed to generate corresponding feedback signals at each rising edge and falling edge of the sampling clock.

15. The system of claim 14, wherein the first feedback block comprises a first switched-resistor circuit and a second switched-resistor circuit,
wherein the first switched-resistor circuit is operable to generate a first set of analog pulses, each of a constant magnitude and a duration equal to one period of the sampling clock, in each of an interval between successive rising edges of the sampling clock, an analog pulse in the first set being generated with a first voltage if the corresponding binary value has a first logic level, the analog pulse in the first set being generated with a second voltage if the corresponding binary value has a second logic level, and wherein the second switched-resistor circuit is operable to generate a second set of analog pulses, each of a constant magnitude and a duration equal to one period of the sampling clock, in each of an interval between successive falling edges of the sampling clock, an analog pulse in the second set being generated with the first voltage if the corresponding binary value has a first logic level, the analog pulse in the second set being generated with the second voltage if the corresponding binary value has a second logic level, wherein the first analog pulse is a sum of the corresponding analog pulse in the first set of analog pulses and the corresponding analog pulse in the second set of analog pulses.

16. The system of claim 14, wherein the first feedback block comprises a first switched-current circuit and a second switched-current circuit, wherein the first switched-current circuit is operable to generate a first set of currents, each of a constant magnitude and a duration equal to one period of the sampling clock, in each of an interval between successive rising edges of the sampling clock, a current in the first set of currents being generated with a first magnitude if the corresponding binary value has a first logic level, the current in the first set of currents being generated with a second magnitude if the corresponding binary value has a second logic level, and wherein the second switched-current circuit is operable to generate a second set of currents, each of a constant magnitude and a duration equal to one period of the sampling clock, in each of an interval between successive falling edges of the sampling clock, a current in the second set of currents being generated with the first magnitude if the corresponding binary value has the first logic level, the current in the second set of currents being generated with the second magnitude if the corresponding binary value has the second logic level, wherein the first analog pulse is a sum of the corresponding current value in the first set of currents and the corresponding current value in the second set of currents.

17. The system of claim 14, wherein the SD ADC further comprises a digital decimation filter to down-sample a digital stream generated by the comparator on a first output node of the comparator, and to generate a final digital stream representing the processed signal in digital form.

* * * * *